(12) United States Patent
Bhat et al.

(10) Patent No.: US 6,934,200 B2
(45) Date of Patent: Aug. 23, 2005

(54) YIELD AND SPEED ENHANCEMENT OF SEMICONDUCTOR INTEGRATED CIRCUITS USING POST FABRICATION TRANSISTOR MISMATCH COMPENSATION CIRCUITRY

(75) Inventors: Navakanta Bhat, Bangalore (IN); Sugato Mukherjee, Boise, ID (US)

(73) Assignee: Indian Institute of Science, Bangalore (IN)

( * ) Notice: Subject to any disclaimer, the term of this patent is extended or adjusted under 35 U.S.C. 154(b) by 0 days.

(21) Appl. No.: 10/471,972

(22) PCT Filed: Mar. 11, 2002

(86) PCT No.: PCT/IN02/00039

§ 371 (c)(1),
(2), (4) Date: Apr. 26, 2004

(87) PCT Pub. No.: WO02/073658

PCT Pub. Date: Sep. 19, 2002

(65) Prior Publication Data

US 2004/0174759 A1 Sep. 9, 2004

(30) Foreign Application Priority Data

Mar. 12, 2001 (IN) ..................................... 216/MAS/2001

(51) Int. Cl.[7] ........................... G11C 7/00; G11C 29/00; G06F 17/50
(52) U.S. Cl. ............................ 365/194; 365/201; 716/6
(58) Field of Search ............................... 365/194, 201; 716/4, 5, 6, 7

(56) References Cited

U.S. PATENT DOCUMENTS

| | | | | |
|---|---|---|---|---|
| 4,604,534 A | | 8/1986 | Pricer | ........................ 307/530 |
| 6,181,621 B1 | | 1/2001 | Lovett | ........................ 365/205 |
| 6,370,676 B1 | * | 4/2002 | Hayashi et al. | ................. 716/6 |
| 6,427,222 B1 | * | 7/2002 | Shau | .............................. 716/4 |
| 6,484,307 B2 | * | 11/2002 | Karl et al. | ...................... 716/4 |
| 6,507,933 B1 | * | 1/2003 | Kirsch et al. | ................... 716/4 |
| 6,684,375 B2 | * | 1/2004 | Tsukiyama et al. | ............ 716/6 |
| 6,728,937 B2 | * | 4/2004 | Wakita et al. | .................. 716/4 |
| 6,807,655 B1 | * | 10/2004 | Rehani et al. | .................. 716/4 |
| 6,823,496 B2 | * | 11/2004 | Bergman Reuter et al. | ..... 716/4 |

OTHER PUBLICATIONS

PCT Written Opinion corresponding to PCT/IN02/00039 mailed on Oct. 23, 2003.

* cited by examiner

*Primary Examiner*—Trong Phan
(74) *Attorney, Agent, or Firm*—DLA Piper Rudnick; Gray Cary US LLP

(57) ABSTRACT

A novel technique for the enhancement of yield and speed of semiconductor integrated circuits using post fabrication transistor mismatch compensation circuitry is provided. The system has a sense amplifier, a multiplexer, delay elements, and a provision for hardwiring fast and slow circuits during packaging of a memory circuit. The sense amplifier firing path is split into a slow and a fast path and the multiplexer can select either the slow path or fast path. The memory circuit is tested after fabrication to assess whether each memory cell can be identified as slow or fast circuits and accordingly the fast path or slow path is selected by the multiplexer. The path for each memory cell may be then hardwired during packaging by connecting a select input of multiplexer to a VDD signal or a ground signal.

19 Claims, 5 Drawing Sheets

YIELD AND SPEED ENHANCEMENT OF SEMICONDUCTOR INTEGRATED CIRCUITS USING POST FABRICATION TRANSISTOR MISMATCH COMPENSATION CIRCUITRY

BACKGROUND OF THE INVENTION

1. Field of the Invention

This invention in general relates to manufacturing of semiconductor. Further this invention is related to manufacturing of VLSI circuits. Further this invention pertains to Semiconductor memory technology such as DRAM, SRAM etc. More particularly this invention encompasses a Yield and Speed Enhancement of Semiconductor Integrated Circuits using Post-Fabrication Transistor Mismatch Compensation Circuitry in Semiconductor memory technology.

2. Description of Prior Art

In semiconductor integrated circuit (IC) manufacturing, there is a typical trade-off between speed and yield. This is even more so when the IC includes analog blocks. For the semiconductor memories such as SRAM and DRAM, the READ access time determines the speed of the memory. The sense amplifier is the most critical analog block in the READ access path. The response speed of the sense amplifier determines the over all speed of the memory. The typical structure of SRAM memory cell with associated bit line capacitance and sense amplifier is shown in FIG. 1. When the cell is accessed, depending on the data stored in the cell, either BL or BL' starts discharging from the pre charged value of Vdd. Since BL and BL' lines have very large capacitance, the sense amplifier is used to amplify the small differential signals on these lines and get the rail to rail swing. The high gain sense amplifier needs to be fired at a precise time when the correct differential voltage is developed at its inputs. Otherwise incorrect data could be latched at the output of the memory.

There are two important factors that impact the sense amplifier firing delay. The first one is related to the tracking of the word line and bit line delays across the process corners and the supply voltage fluctuations. The problem becomes worse with the scaling of CMOS technology into the deep sub-micron regime and the associated lower supply voltages. This problem is typically solved by generating the sense control signal by techniques such as replica memory cell.

The second problem relates to the transistor mismatch in the sense amplifier itself. Since the sense amplifier is essentially a differential amplifier, any mismatch in the threshold voltage and the gain factor of the transistors in the two arms of the amplifier shows up as an input offset voltage. In presence of such input offset voltage, the sense amplifier firing signal will have to be further delayed so that the differential voltage developed at the BL and BL' lines can compensate the offset voltage. Since this problem arises AT THE LOCATION of the signal amplification, it is not possible to predict the offset a-priori, or even track the offset as in the case of bit line delay tracking. So the sense amplifier design is typically done for the worst case offset condition, by delaying the firing signal in order to compensate the offset voltage. This approach will slow down the sense amplifier significantly depending on the magnitude of the mismatch.

As the CMOS technology is scaled to the deep sub micron regime, the random dopant fluctuation effects will increase, thereby making the transistor mismatch worse. If a fab needs a design index of 6σ for yield consideration, the sense amplifier firing will be delayed to cancel the 6σ transistor mismatch. Assuming a normal distribution of transistor mismatch across the wafer lots, the FIG. 2 gives the percentage of sense amplifiers within certain σ value. It should be noted that a 1σ value corresponds to 84% of the devices. In other words, the design index of 6σ implies that for the sake of 16% more devices, 84% of the devices are penalized with respect to the speed. Had it not been for the delayed sense amplifier firing, these 84% of the devices would be in a different higher speed bin, which in turn translates to higher revenue for the fab! At the same time delaying the sense amplifier firing by 1σ value to get high speed IC's means 16% lower yield. When a fab is shipping millions of IC's, 16% lower yield implies a big hit on revenue. Hence in order to get the best of speed and yield, one would require a programmable sense amplifier firing design technique.

Some techniques have been proposed to do offset cancellation of the sense amplifier. However, these suffer from the drawback of slowing down the intrinsic speed of the sense amplifier due to the loading of the output nodes by extra circuitry required for mismatch compensation. Furthermore the mismatch compensation is not to the tune of 100%.

Limitations

Typical 6σ design index for the fab results in slowing down majority of the chips, which are inherently fast due to lower transistor mismatch. In the Deep Sub-Micron technologies, the speed difference will be more than a factor 2 for the 6σ design index versus 1σ design index, i.e. the memory chip which could potentially run at 2 GHz, will have to be marketed with a 1 GHz label.

A manufacturer who likes to be the first to introduce the fastest chips into the market and thereby capture the market can potentially run the fab with 1σ design index. However, the associated loss of yield is enormous which again impacts the bottom line of the fab.

Some of the techniques proposed such as cancellation of sense amplifier offset suffers from the disadvantage of slowing down the inherent response speed of the sense amplifier.

BRIEF SUMMARY OF THE INVENTION

It is the primary object of the invention to design a novel circuitry to fire the sense-amplifier in a memory circuit wherein, the firing delay introduced is a function of transistor mismatch in the sense amplifier resulting after the fabrication.

It is another object of the invention to invent a circuitry to extend to have 2 or more speed bins by introducing different delay paths controlled by multiplexer.

It is another object of this invention that to apply this circuitry to any VLSI circuit wherein the transistor mismatch happens to be a speed and yield critical path.

It is another object of the invention to split the firing delay path into two such as fast path and slow path, which would correspond to lower transistor mismatch and higher transistor mismatch.

It is another object of the invention to adjust the timing for the two paths by a pass gates, buffers, passive interconnect resistor or any other delay element.

It is another object of the invention to use a 2 to 1 multiplexer to select either fast or slow path using the control signal SPEED to select all the signals of such multiplexers in a single chip to connect together and to bring out the signal to correspond with the SPEED pad.

It is another object of the invention to sort the functional chips as slow chips and fast chips by testing the functionality with the SPEED pad connected to logic "1" and logic "0".

BRIEF DESCRIPTION OF THE DRAWINGS

Now this invention will be described in detail. The description of the invention will refer to the accompanying drawings of the complete specification. The descriptions will extensively deal with the nature of the invention and the manner in which it is to be performed.

The statements of the drawings, which accompany this complete specification, are as follows:

FIG. 3 (b): Shows the Circuitry indicating possible delay element and multiplexer Implementation;

DETAILED DESCRIPTION OF THE INVENTION

Figure 1:
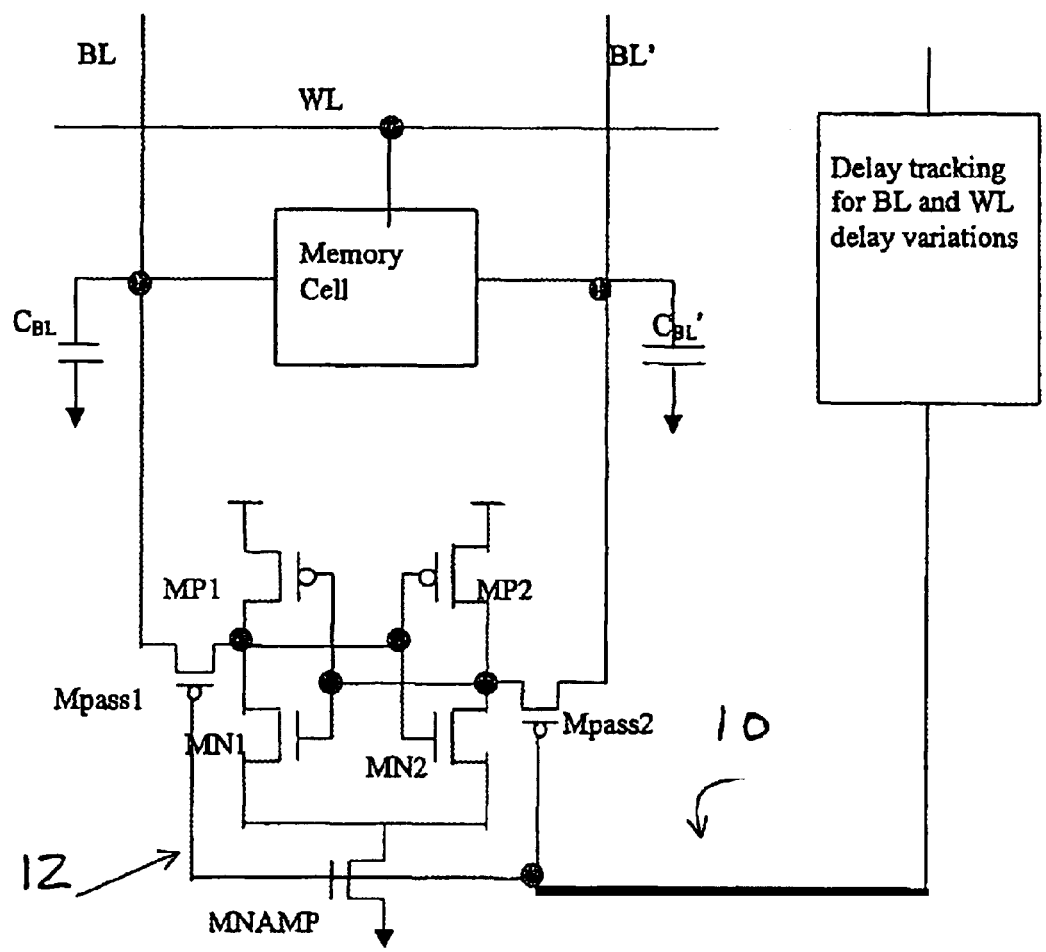
FIG. 1: Shows the Circuit Diagram of Conventional sense amplifier firing for SRAM circuit.
Figure 2:
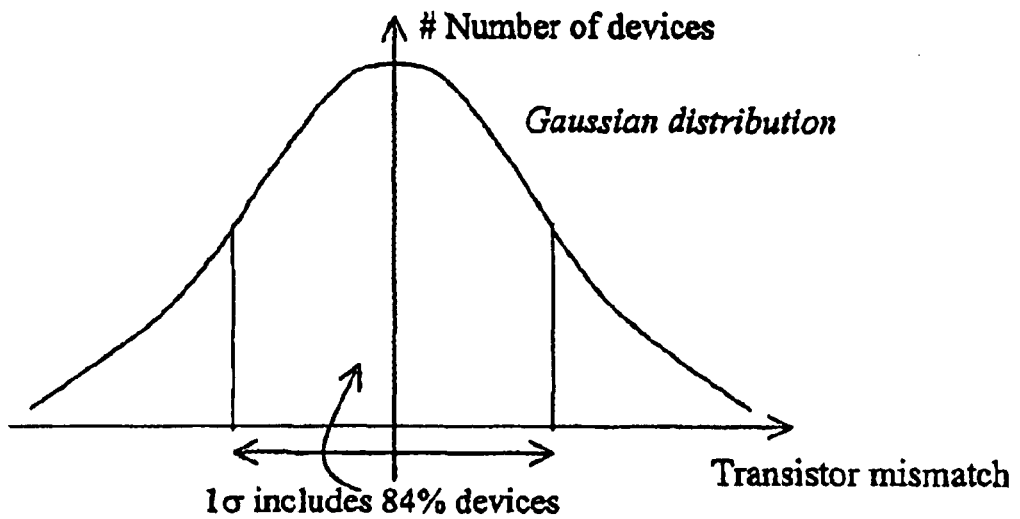
FIG. 2: Shows the graphical representation in respect of the Percentage of devices within certain mismatch value for Gaussian distribution.

FIG. No. 1 shows the conventional memory design with respect to a sense amplifier firing signal 10 (prior art). The conventional memory design includes bit lines (BL, BL'), a word line (WL), a memory cell connected to the word line and bit lines, and capacitors ($C_{BL}$, $C_{BL'}$) connected to each bit line and the memory cell. Each word line is also connected to a latch-type sense amplifier 12. The Latch type sense amplifier is shown in FIG. No. 1 here for illustration, the proposed invention could be applied to any sense-amplifier configuration. The three transistor pairs MN1-MN2, Mpass1-Mpass2 and MP1-MP2 constitute the latch type sense amplifier. The process variations result in device mismatch in these matched pairs, which manifests itself as the offset of the sense amplifier. The conventional design (prior art) attempts to accommodate the worst case offset, resulting in pessimistic design by building in slackness to achieve 6 σ design index. The design slackness is reflected in the delayed sense amplifier firing signal (see delay tracking for BL and WL delay variations shown in FIG. 1. The 6σ design index achieves the high yield (FIG. 2) but at the expense of speed wherein FIG. 2 shows the Gaussian distribution of transistor mismatch and a chart with the percentage of devices that with a particular transistor mismatch.

Figure 3:
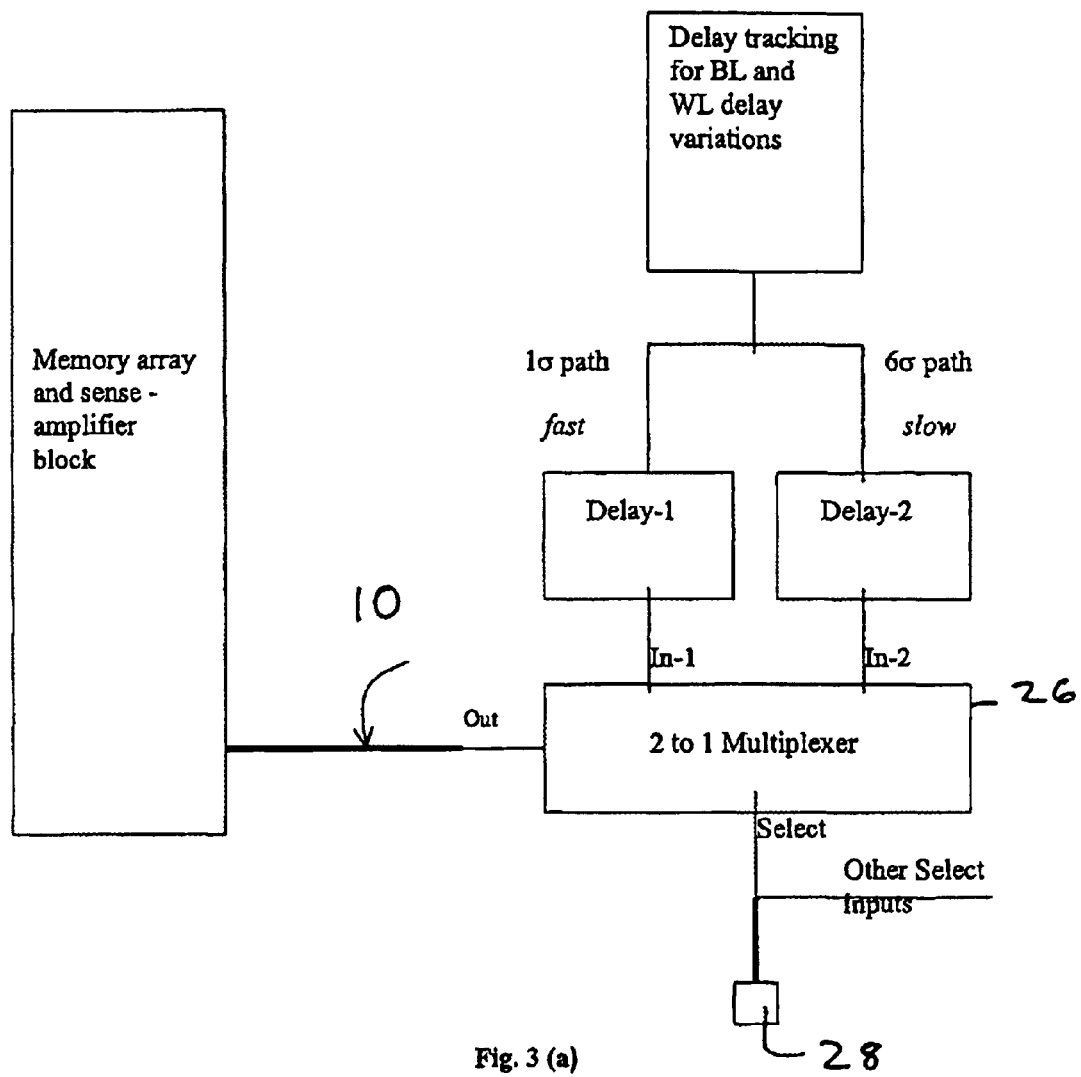
FIG. 3 (a): Split sense amplifier firing path with multiplexer according to the invention.
Figure 3:
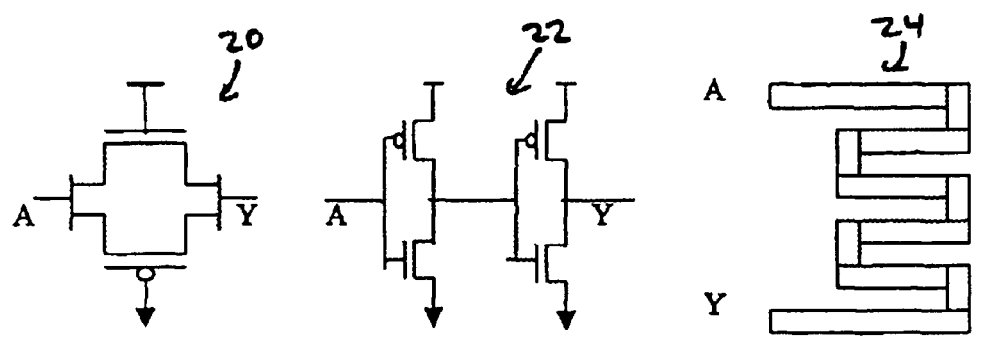
Figure 3:
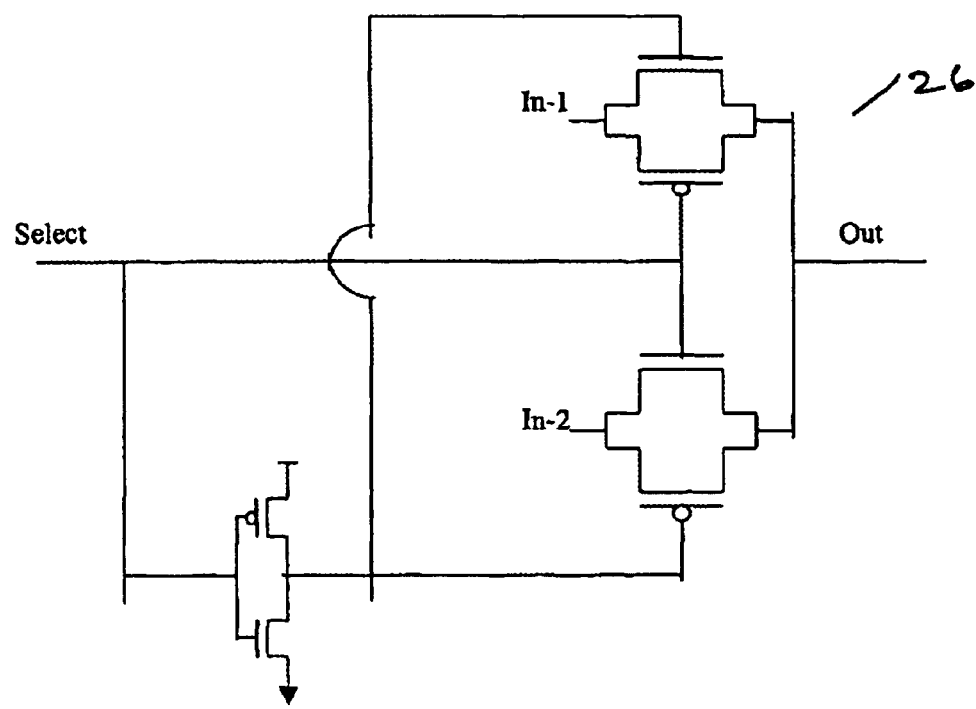
Figure 4:
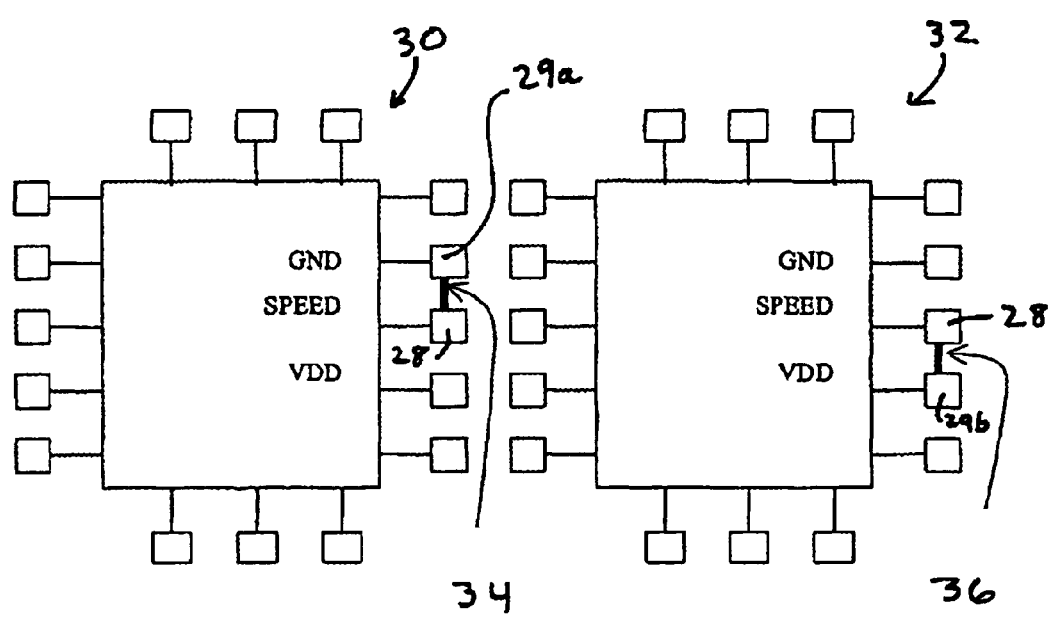
FIG. 4: Shows the details of Hardwiring for fast and slow chips during packaging.

The proposed invention is illustrated in FIGS. 3 (a) and (b) connected to a conventional memory array and sense amplifier block (see FIG. 1) by the sense amplifier firing signal 10. In this proposed invention the sense amplifier firing path is split into two labeled as 1σ path and 6σ path. One of them is corresponding to "fast chips" and the other one to "slow chips". The delays in the fast and slow paths are appropriately adjusted (See Delay-1 and Delay-2 in FIG. 3 (a), depending on the required design index. For the example shown in the FIG. 3 (a), the fast path corresponds to 1 σ and the slow path corresponds to 6 σ design index (transistor mismatch). These numbers could be different depending on the requirement of a particular implementation. The delays in these two paths can be tuned by using delay elements such as pass gate delay elements 20, buffer delay elements 22, passive interconnect delay elements 24 as shown in FIG. 3(b). The delay in pass gate and buffer can be adjusted by varying the length and width of the transistors whereas the delay in the interconnect can be adjusted by varying length and width of metal line. The implementation of a 2-1 multiplexer 26 is shown in FIG. 3(b). The 2-1 multiplexer selects one of the two paths (In-1 and In-2) to fire the sense amplifier (Out) as shown in FIG. 3(a). The status of select input (GND or VDD) of the multiplexer determines whether In-1 or In-2 is transmitted to the output. The select inputs of all such multiplexers in a single chip are connected together and brought out as "SPEED" pad 28 as shown in FIG. 4. When "SPEED"=0, the fast path is used to control sense amplifier and when "SPEED"=1, the slow path is used. (The logic could also be reversed, by changing the multiplexer connections appropriately). After the fabrication is completed, the IC's are tested at wafer level to assess the functionality. If a particular chip works with SPEED=0, then it is marked as fast chip. Otherwise, the chip is re-tested with SPEED=1,and the functional chip is marked as slow chip. Then after dicing, the chips are hardwired into fast or slow bins (fast chips 30 and slow chips 32) during the packaging step. For all the fast chips, the SPEED pad is shorted to a GND pad 29a via a lead 34 and for the slow chips the SPEED pad is shorted to a VDD pad 29b via a lead 36 as shown in FIG. 4. The VDD and GND pads are adjacent to SPEED pad. Note that the SPEED pad need not be connected to an external package pin and hence the hardwiring process does not impact the connectivity of the chip in the system design. The pads are shown in FIG. 4 at the periphery of the chips in this implementation. However, the pads could also be in the core as in the case of flip-chip packaging. This technique would be applied irrespective of the type of packaging.

This results in 84% of the chips in high speed bin and 16% of the chips in low speed bin without compromising on memory speed and yield. This in turn translates into a very significant enhancement in the revenue of the fab.

While the invention has been particularly shown and described with reference to the preferred embodiments thereof, it will be understood by those skilled in the art that various changes in form and detail may be made therein without departing from the spirit and scope of the invention.

What is claimed is:

1. A system for high yield and speed enhancement of semiconductor integrated circuits such as SRAM and DRAM using post fabrication transistor mismatch compensation circuitry comprising: a sense amplifier for providing high memory yield and speed enhancement using post fabrication, transistor mismatch compensation circuit, wherein a sense amplifier firing path is split into two paths, one path corresponding to fast chips and the other to the slow chips, and a multiplexer which selects one of the two paths to fire the sense amplifier such that more than 80 % of the memory integrated circuits work as fast circuits (fast path) and a remainder of the memory integrated circuits are still functional (slow path) without compromising the yield; and delay elements for effecting delay in the fast and slow paths.

2. A system for high yield and speed enhancement of semiconductor integrated circuits as claimed in claim 1, wherein the delay in the sense amplifier fast and slow firing paths are adjusted depending on the required design index.

3. A system for high yield and speed enhancement of semiconductor integrated circuits as claimed in claim 1, wherein the fast path corresponds to a first design index and the slow path corresponds to a second design index (transistor mismatch) wherein the second design index is greater than the first design index.

4. A system for high yield and speed enhancement of semiconductor integrated circuits as claimed in claim 1, wherein the delay in the two paths can be tuned by using the delay elements including one or more of a pass gate, a buffer, and a passive interconnect resistor.

5. A system for high yield and speed enhancement of semiconductor integrated circuits as claimed in claim 1, wherein a 2-1 multiplexer selects one of the fast path and slow path using a SPEED control signal so that the control signal of the multiplexers in a single chip are connected together and connected to a SPEED pad.

6. A system for high yield and speed enhancement of semiconductor integrated circuits as claimed in claim 1, wherein the fast path is selected when the SPEED control signal=0 and the slow path is selected when the SPEED control signal=1.

7. A system for high yield and speed enhancement of semiconductor integrated circuits as claimed in claim 1, wherein after the fabrication is completed, the chips are tested at wafer level to assess if the chips are fast chips and marking a particular chip as fast if the chip is functional at SPEED=0 and slow if the chip is not functional at SPEED=0, but is functional at SPEED=1 thus dicing and separating into fast or slow bins during a packaging.

8. A system for high yield and speed enhancement of semiconductor integrated circuits as claimed in claim 5, wherein for the fast chips, the SPEED pad is shorted to a GMD pad and for the slow chips, the SPEED pad is shorted to a VDD pad wherein the VDD and GND pads are adjacent to SPEED pad.

9. A semiconductor memory, comprising:
one or more memory cells;
a sense amplifier connected to each memory cell;
a firing signal circuit connected to the sense amplifier, the firing signal circuit further comprising a first input path and a second input path to a multiplexer wherein a firing signal is output from the multiplexer and is connected to the sense amplifier to trigger the sense amplifier based on one of the first and second input paths, the first input path having a first delay and the second input path having a second delay so that the memory cell is operated as one of a fast circuit using the first input path and as a slow circuit using the second input path.

10. The memory of claim 9, wherein the firing signal circuit further comprises a select signal line connected to the multiplexer that selects between the first and second input paths in order to select one of the fast circuit and the slow circuit for the memory cell operation.

11. The memory of claim 9, wherein the first and second delays each further comprise a delay element that delays the signal through the first and second input paths, respectively, the delay element further comprising one of a pass gate, a buffer, and a passive interconnect resistor.

12. The memory of claim 10, wherein the firing signal circuit further comprises a speed pad associated with the memory wherein the select signal line is connected to the speed pad so that a signal on the speed pad selects the first and second input paths.

13. The memory of claim 12 further comprising a ground pad and a VDD pad wherein the speed pad is connected to one or the ground pad and the VDD pad to select one of the first input path and the second input path.

14. A semiconductor memory sense circuit, comprising:
a sense amplifier connected to a memory cell; and
a firing signal circuit connected to the sense amplifier, the firing signal circuit further comprising a first input path and a second input path to a multiplexer wherein a firing signal is output from the multiplexer and is connected to the sense amplifier to trigger the sense amplifier based on one of the first and second input paths, the first input path having a first delay and the second input path having a second delay so that the memory cell is operated as one of a fast circuit using the first input path and as a slow circuit using the second input path.

15. The sense circuit of claim 14, wherein the firing signal circuit further comprises a select signal line connected to the multiplexer that selects between the first and second input paths in order to select one of the fast circuit and the slow circuit for the memory cell operation.

16. The sense circuit of claim 14, wherein the first and second delays each further comprise a delay element that delays the signal through the first and second input paths, respectively, the delay element further comprising one of a pass gate, a buffer, and a passive interconnect resistor.

17. The sense circuit of claim 15 further comprising a memory chip into which the sense amplifier is integrated, wherein the firing signal circuit further comprises a speed pad associated with the memory chip wherein the select signal line is connected to the speed pad so that a signal on the speed pad selects the first and second input paths.

18. The sense circuit of claim 17, wherein the memory chip further comprises a ground pad and a VDD pad wherein the speed pad is connected to one or the ground pad and the VDD pad to select one of the first input path and the second input path.

19. A method for selectively operating memory cells in a memory as one of a fast circuit and a slow circuit, comprising:
manufacturing a memory chip having one or more memory cells, a sense amplifier connected to each memory cell and a firing signal circuit connected to the sense amplifier, the firing signal circuit further comprising a first input path and a second input path to a multiplexer wherein a firing signal is output from the multiplexer and is connected to the sense amplifier to trigger the sense amplifier based on one of the first and second input paths, the first input path having a first delay and the second input path having a second delay so that the memory cell is operated as one of a fast circuit using the first input path and as a slow circuit using the second input path;
testing the memory chip to determine if each memory cell is one of a fast circuit and a slow circuit; and
hardwiring a speed pad associated with the firing signal circuit to one of a ground pad and a VDD pad in order to operate each memory cell in the memory chip as one of a fast circuit and a slow circuit based on the testing so that the manufactured memory chip has both fast circuits and slow circuits.

* * * * *